United States Patent
Matsumori et al.

(10) Patent No.: US 9,012,972 B2
(45) Date of Patent: Apr. 21, 2015

(54) NONVOLATILE SEMICONDUCTOR STORAGE DEVICE AND METHOD OF MANUFACTURING THE SAME

(71) Applicant: Kabushiki Kaisha Toshiba, Minato-ku (JP)

(72) Inventors: Hisakazu Matsumori, Yokkaichi (JP); Hideto Takekida, Nagoya (JP); Akira Mino, Yokkaichi (JP); Jun Murakami, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/019,844

(22) Filed: Sep. 6, 2013

(65) Prior Publication Data

US 2014/0231896 A1 Aug. 21, 2014

(30) Foreign Application Priority Data

Feb. 20, 2013 (JP) ................... 2013-030976

(51) Int. Cl.
| | |
|---|---|
| H01L 29/788 | (2006.01) |
| H01L 29/423 | (2006.01) |
| H01L 29/40 | (2006.01) |
| H01L 21/28 | (2006.01) |
| H01L 27/115 | (2006.01) |
| H01L 29/66 | (2006.01) |

(52) U.S. Cl.
CPC ........ *H01L 29/42324* (2013.01); *H01L 29/401* (2013.01); *H01L 21/28273* (2013.01); *H01L 27/11529* (2013.01); *H01L 29/66825* (2013.01); *H01L 29/7881* (2013.01)

(58) Field of Classification Search
CPC .................. H01L 29/42324; H01L 29/66825; H01L 29/788
USPC ..................... 257/316; 438/266, 593
See application file for complete search history.

(56) References Cited

U.S. PATENT DOCUMENTS

| | | |
|---|---|---|
| 6,335,289 B1 | 1/2002 | Kikuchi |
| 8,058,132 B2 | 11/2011 | Ahn et al. |

(Continued)

FOREIGN PATENT DOCUMENTS

| | | |
|---|---|---|
| JP | 2000-269216 A | 9/2000 |
| JP | 2002-176114 A | 6/2002 |
| JP | 2008-166415 A | 7/2008 |

(Continued)

*Primary Examiner* — Tu-Tu Ho
(74) *Attorney, Agent, or Firm* — Oblon, McClelland, Maier & Neustadt, L.L.P.

(57) ABSTRACT

A nonvolatile semiconductor storage device includes a semiconductor substrate; a first insulating film disposed above the semiconductor substrate; a first electrode film disposed above the first insulating film; a second insulating film disposed above the first electrode film; a second electrode film disposed above the second insulating film; a third electrode film filling a first trench and overlying the second electrode film, the first trench having a first width and a first depth and extending through the second electrode film and the second insulating film and into the first electrode film; and a first barrier metal film and a first metal film disposed above the third electrode film; wherein the third electrode film above the second electrode film has a first thickness equal to or less than ½ of the first width of the first trench.

17 Claims, 17 Drawing Sheets

(56) References Cited

U.S. PATENT DOCUMENTS

| | | |
|---|---|---|
| 2002/0036317 A1 | 3/2002 | Matsui et al. |
| 2008/0237686 A1 | 10/2008 | Yabuhara |
| 2010/0065900 A1 | 3/2010 | Murata et al. |
| 2013/0228842 A1* | 9/2013 | Kotou et al. ............ 257/315 |

FOREIGN PATENT DOCUMENTS

| | | |
|---|---|---|
| JP | 2008-244108 A | 10/2008 |
| JP | 2009-99928 A | 5/2009 |
| JP | 2010-16165 A | 1/2010 |
| JP | 2010-73812 A | 4/2010 |

* cited by examiner

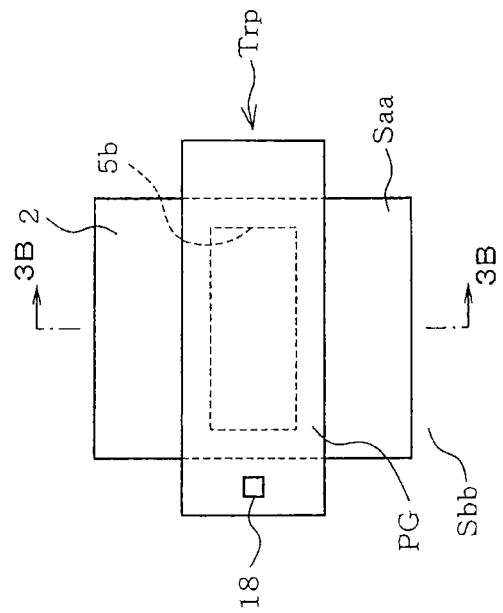
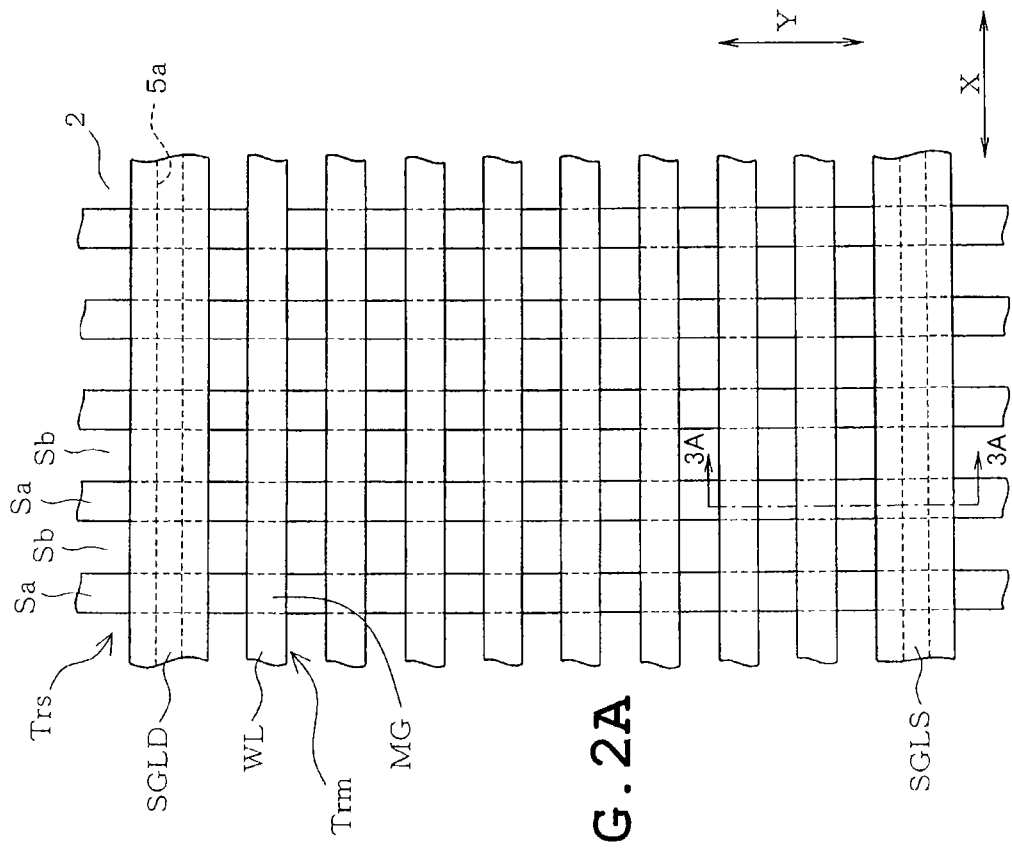
FIG. 2B
FIG. 2A

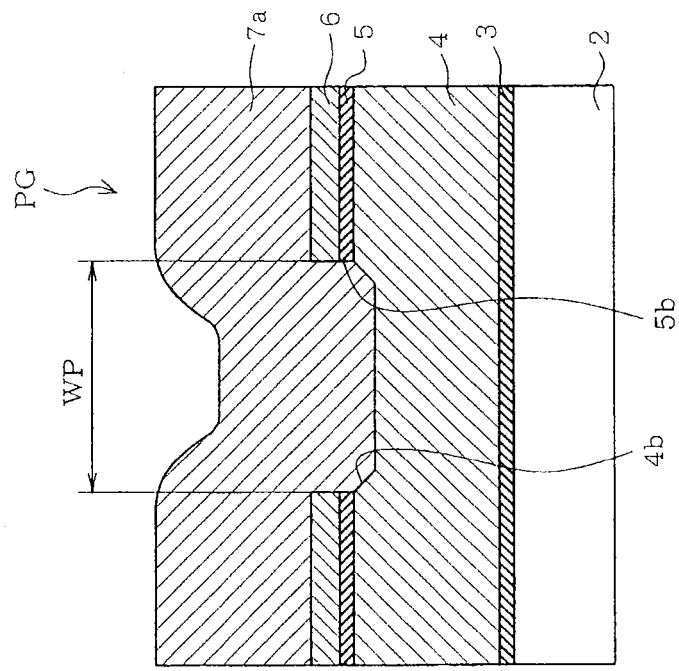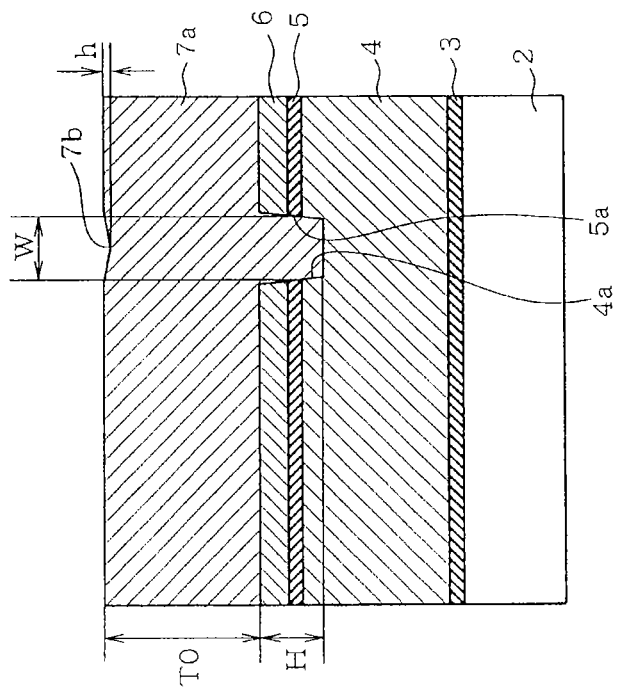
FIG. 7A
FIG. 7B

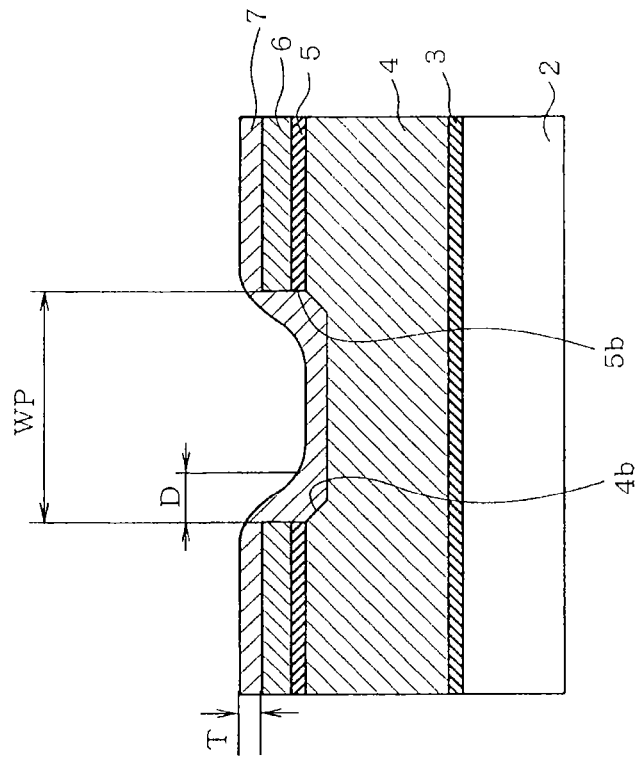
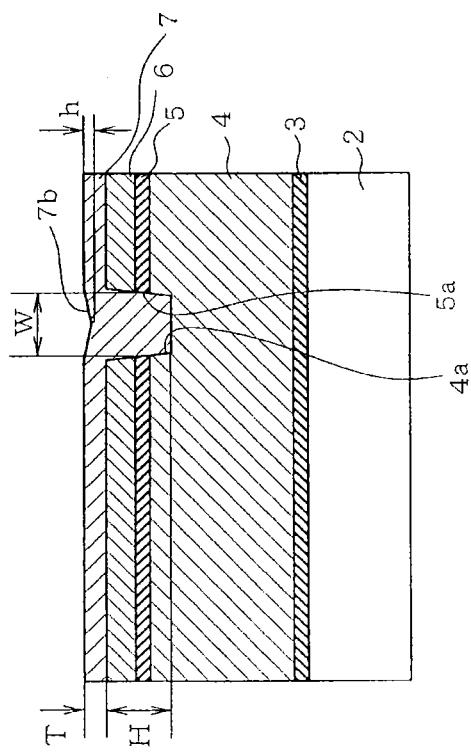
FIG. 8A
FIG. 8B

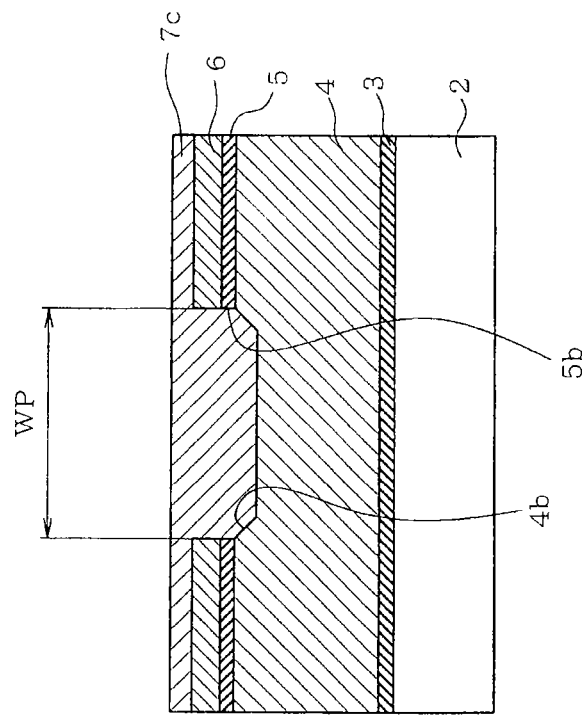
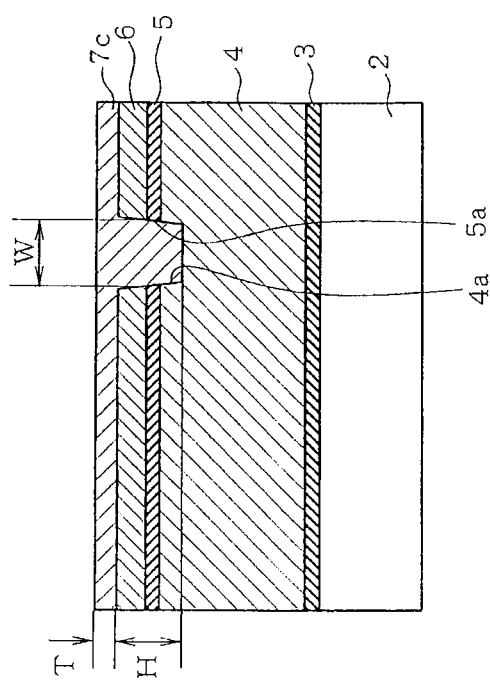
FIG. 18A
FIG. 18B

NONVOLATILE SEMICONDUCTOR STORAGE DEVICE AND METHOD OF MANUFACTURING THE SAME

CROSS-REFERENCE TO RELATED APPLICATION(S)

This application is based upon and claims the benefit of priority from Japanese Patent Application No. 2013-030976, filed on, Feb. 20, 2013 the entire contents of which are incorporated herein by reference.

FIELD

Embodiments disclosed herein generally relate to a nonvolatile semiconductor storage device and a method of manufacturing the same.

BACKGROUND

In devices such as a NAND flash memory device having a floating gate structure as a data storage element, a control gate electrode is typically formed above the floating gate electrode via an interelectrode insulating film in a memory-cell transistor.

In such case, a select transistor and a peripheral circuit transistor formed simultaneously with a memory-cell transistor is not needed to store the data. Thus, an opening is formed through the interelectrode insulating film to electrically connect the overlying electrode film and the underlying electrode film.

Such structure is formed by the following manufacturing process flow. A lower electrode film, an interelectrode insulating film, and a thin layer of first upper electrode film are stacked, and an opening of a predetermined width is formed by etching through the first upper electrode film and the interelectrode insulating film in portions where the gate electrodes are to be formed. The etching further progresses into the underlying lower electrode film to ensure that the upper and the lower electrode films are connected. Thus, in the opening formed through the first upper electrode film and the interelectrode film, and in the recess formed into the overetched lower electrode film, a step is formed. Then, a second upper electrode film is filled into the opening and the recess to obtain an electrically connected structure.

In such structure, it may not be possible to eliminate the step depending upon the relation between the width of the opening and the thickness of the upper electrode film filing. When the upper electrode film is thin, above phenomenon easily occurs.

For instance, in some NAND flash memory devices, control gate electrode has a metal film formed above the upper surface of a thin electrode film comprising a silicon film via a barrier metal film. The presence of a step in such structure may cause the barrier metal film to be thinned or disconnected on the step. As a result the metal film stacked after the formation of the barrier metal film may come in direct contact with the underlying silicon film and may cause unwanted failures.

BRIEF DESCRIPTION OF THE DRAWINGS

FIG. 2A is one example of a planar layout of the memory cell region.

FIG. 2B is one schematic example of a plan view of a peripheral circuit transistor.

FIGS. 4, 5, 6, 7A, 7B, 8A, 8B and 9 each illustrate one phase of the manufacturing process flow; where FIGS. 4, 5, 6, 7A, 8A, and 9 each illustrate one schematic example of a vertical cross-sectional view taken along line 3A-3A of FIG. 2A; and FIGS. 7B and 8B, each illustrate one schematic example of a vertical cross-sectional view taken along line 3B-3B of FIG. 2B.

FIG. 10A is one schematic example of a vertical cross sectional view taken along line 3A-3A of FIG. 2A and FIG. 10B is one schematic example of a vertical cross sectional view taken along line 3B-3B of FIG. 2B.

FIG. 14B illustrates one schematic example of a vertical cross-sectional view taken along line 3B-3B of FIG. 2B.

FIG. 17A is one schematic example of a vertical cross sectional view taken along line 3A-3A of FIG. 2A and FIG. 17B is one schematic example of a vertical cross sectional view taken along line 3B-3B of FIG. 2B.

FIGS. 18A and 18B, and 19 each illustrate one phase of the manufacturing process flow; where FIGS. 18A and 19 each illustrate one schematic example of a vertical cross-sectional view taken along line 3A-3A of FIG. 2A; and FIG. 18B illustrate one schematic example of a vertical cross-sectional view taken along line 3B-3B of FIG. 2B.

DESCRIPTION

In one embodiment, a nonvolatile semiconductor storage device is disclosed. The device includes a semiconductor substrate; a first insulating film disposed above the semiconductor substrate; a first electrode film disposed above the first insulating film; a second insulating film disposed above the first electrode film; a second electrode film disposed above the second insulating film; a third electrode film filling a first trench and overlying the second electrode film, and the first trench having a first width and a first depth and extending through the second electrode film and the second insulating film and into the first electrode film; and a first barrier metal film and a first metal film formed in the listed sequence above the third electrode film; wherein the third electrode film above the second electrode film has a first thickness equal to or less than ½ of the first width of the first trench.

EMBODIMENTS

Embodiments are described hereinafter through a NAND flash memory device application with references to the accompanying drawings. The drawings are not drawn to scale and thus, do not reflect the actual measurements of the features such as the correlation of thickness to planar dimensions and the relative thickness of different layers. Further, directional terms such as up, upper, upward, down, lower, downward, left, leftward, right, and rightward are used in a relative context with an assumption that the worked surface, on which circuitry is formed, of the later described semiconductor substrate faces up. Thus, the directional terms do not necessarily correspond to the directions based on gravitational acceleration.

First Embodiment

A description is given hereinafter on a first embodiment with reference to FIGS. 1 to 9.

Figure 1:
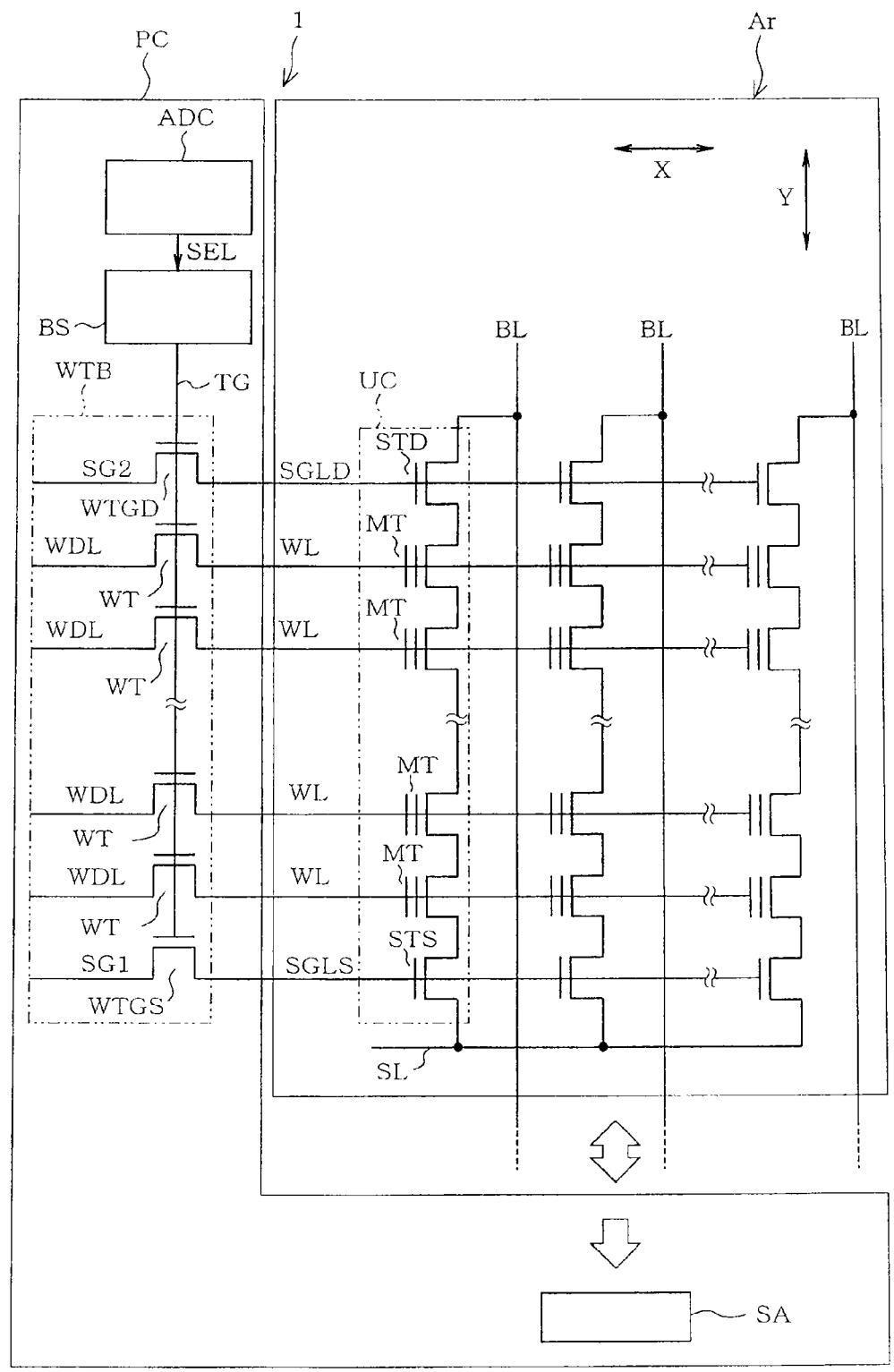
FIG. 1 is one schematic example partially illustrating an electrical configuration of a memory cell region and a peripheral circuit region of a NAND Flash memory device according to a first embodiment.

FIG. 1 is one schematic example of an electrical configuration of NAND flash memory device 1 represented by a block diagram. As shown in FIG. 1, NAND flash memory device 1 primarily comprises memory cell array Ar, peripheral circuit region PC and input/output interface circuitry not shown. Memory cell array Ar is configured by multiplicity of memory cells arranged in a matrix. Peripheral circuit PC is configured to read/program/erase each of the memory cells in memory cell array Ar.

Memory cell array Ar located in the memory cell region includes multiplicity of units of cells referred to as cell units UC. Cell unit UC comprises $2^k=m$ number of series connected memory-cell transistors Trm, such as 32 in number, situated between a couple of select transistors STD and STS that are located at Y-direction ends of cell unit UC as viewed in FIG. 1. Select transistors STD are connected to bit line BL, whereas select transistors STS are connected to source line SL.

A row containing n number cell units UC, taken along the left and right direction or the X direction as viewed in FIG. 1, constitutes one block. FIG. 1 only shows one block for simplicity.

The memory cell region is surrounded by the peripheral circuit region and as partially shown in FIG. 1, peripheral circuit PC is located in the periphery of memory cell array Ar. Peripheral circuit PC includes address decoder ADC, sense amplifier SA, step-up circuit BS provided with a charge pump circuit, and transfer transistor WTB. Address decoder ADC is electrically connected to transfer transistor WTB through step-up circuit BS.

Address decoder ADC selects a given block based on an incoming address signal provided from an external component and sends block selection signal SEL to step-up circuit BS as shown in FIG. 1. Step-up circuit BS receives drive voltage from an external component, and when receiving block selection signal SEL from address decoder ADC, steps up the drive voltage and supplies the stepped up voltage, being stepped up to a predetermined level to transfer transistors WTGD, WTGS, and WT by way of transfer gate line TG.

Transfer transistor WTB is a general identification of transfer transistor WTGD, transfer transistor WTGS, and word line transfer transistors WT. Transfer transistor WTB is given on a block by block basis.

Transfer transistor WTGD is configured such that either of the drain and source is connected to select gate driver line SG2, and the remaining other is connected to select gate line SGLD. Transfer transistor WTGS is configured such that either of the drain and source is connected to select gate driver line SG1, and the remaining other is connected to select gate line SGLS. Each of word line transfer transistors WT is configured such that either of the drain and source is uniquely connected to word line drive signal line WDL respectively, and the remaining other is uniquely connected to word line WL.

Gate electrodes SG of select transistors STD of the X-directionally aligned cell units UC are electrically connected by common select gate line SGLD. Similarly, gate electrodes SG of select transistors STS of the X-directionally aligned cell units UC are electrically connected by common select gate line SGLS. As described earlier, the source of each select transistor STS is connected to common source line SL. In the descriptions directed to FIG. 2A and beyond, select transistors STD and STS are also generally referred to as select transistor Trs. Gate electrodes MG of memory-cell transistors MT of the X-directionally aligned cell units UC are each electrically connected by common word line WL respectively.

Gate electrodes of transfer transistors WTGD, WTGS, and WT are interconnected by common transfer gate line TG, which is turn, connected to an output terminal of step up circuit BS for supplying stepped up voltage. Sense amplifier SA is connected to bit line BL and is further connected to a latch circuit that serves as a temporary storage of data read during a read operation.

FIG. 2A is one example of a planar layout of the memory cell region in part. As shown in FIG. 2A, multiplicity of element isolation regions Sb run in the Y direction as viewed in FIG. 2A of semiconductor substrate, exemplified as silicon substrate 2 in the first embodiment. The isolation employs an STI (shallow trench isolation) scheme in which trenches are filled with an insulating film. Element isolation regions Sb are separated from one another in the X direction as viewed in FIG. 2A by a predetermined space interval. Thus, element isolation regions Sb isolate element regions Sa, formed in a surface layer of semiconductor substrate 2 along the Y direction, in the X direction.

Still referring to FIG. 2A, multiplicity of word lines WL, spaced from one another in the Y direction by a predetermined spacing, extend in the X direction which is the direction orthogonal to the Y direction in which element region Sa extends. Above element region Sa located at the intersection with word line WL, gate electrode MG of memory-cell transistor Trm is formed.

The Y-directionally adjacent memory-cell transistors Trm constitute a part of a NAND string. Select transistors Trs is typically provided on each of the Y-directional ends of the NAND string such that the Y-directionally adjacent memory-cell transistors Trm are interposed between the pair of select transistors Trs. As described earlier, a plurality of select transistors Trs are aligned in the X direction as viewed in FIG. 2A. Select gate electrodes SG of select transistors Trs are electrically interconnected by select gate line SGL. Select gate electrode SG of select transistor Trs is formed above element region Sa intersecting with select gate line SGL.

FIG. 2B provides a planar layout of peripheral circuit transistor Trp located in the peripheral circuit region. In semiconductor substrate 2 located in the peripheral circuit region, a plurality of rectangular element regions Saa are formed which are each surrounded by element isolation region Sbb. Peripheral circuit transistor Trp is formed in this rectangular element region Saa. Above element region Saa, isolated gate electrode PG is formed so as to extend across element region Saa. Element region Saa is further provided with a source/drain region formed by impurity diffusion on both sides of gate electrode PG. Gate contact 18 to gate electrode PG is located in element isolation region Sbb.

Figure 3B:
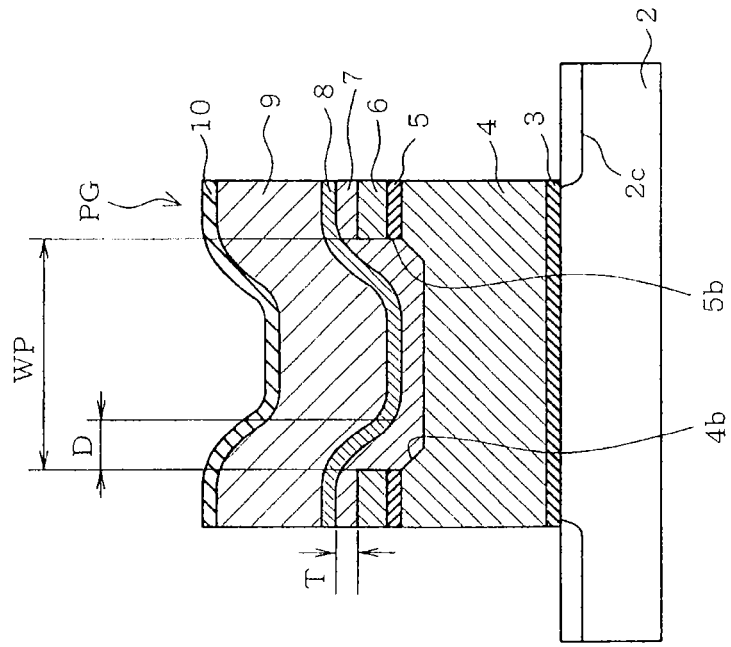
FIG. 3B is one schematic example of a vertical cross sectional view taken along line 3B-3B of FIG. 2B.
Figure 3A:
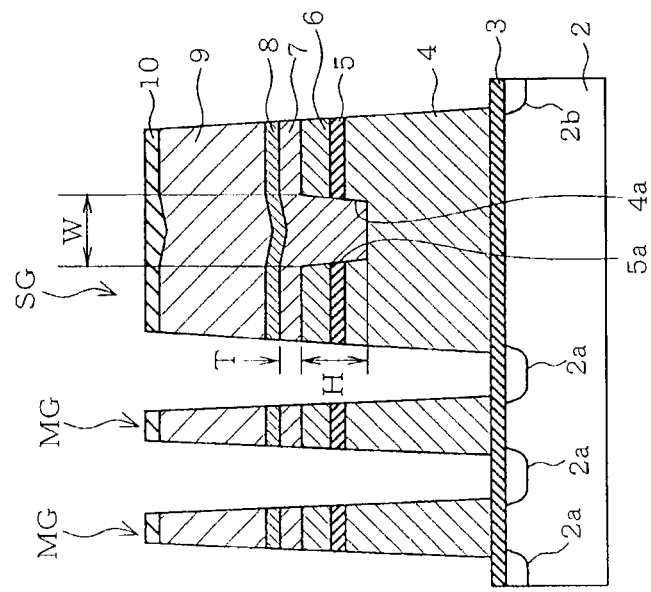
FIG. 3A is one schematic example of a vertical cross sectional view taken along line 3A-3A of FIG. 2A.

FIGS. 3A and 3B are examples of schematic cross sectional views of the elements located in the memory cell region and the peripheral circuit region. FIG. 3A is a vertical cross sectional view of memory-cell transistors Trm and select transistor Trs taken along line 3A-3A of FIG. 2A. FIG. 3B is a vertical cross sectional view of peripheral circuit transistor Trp taken along line 3B-3B of FIG. 2B. FIGS. 3A and 3B show memory-cell transistor Trm, select transistor Trs, and peripheral circuit transistor Trp with their gate electrodes isolated.

Referring to FIG. 3A, first gate insulating film 3, for example, a silicon oxide film is formed above silicon substrate 2. Gate electrode MG of memory-cell transistor Trm and gate electrode SG of select transistor Trs are formed above first gate insulating film 3 in a predetermined spacing. In the first embodiment, memory-cell transistor Trm comprises gate insulating film 3, gate electrode MG, and source/drain region 2a formed in silicon substrate 2 located on both sides of gate electrode MG. As described earlier, multiple memory-cell transistors Trm are series connected in the Y direction as viewed in FIG. 2A to form cell unit UC.

Cell unit UC terminate with select transistor Trs provided on both Y directional ends. Thus, select gate electrode SG of cell unit UC opposes select gate electrode SG of a Y-directionally adjacent cell unit UC or a block with a predetermined spacing therebetween. In this case, the Y direction is taken in the direction opposite the direction in which the adjacent memory cell transistors Trm are located. The spaced region between the select gate electrodes SG of Y-directionally adjacent cell units UC or blocks serves as drain region 2B connected to a bit line contact or as a source region connected to a source line contact as the case may be.

Gate electrode MG of memory-cell transistor Trm includes polycrystalline silicon film 4, interelectrode insulating film 5, polycrystalline silicon films 6 and 7, tungsten nitride (WN) film 8, and tungsten (W) film 9 stacked in the listed sequence above first gate insulating film 3. Silicon nitride film 10 is further formed above tungsten film 9. Polycrystalline silicon film 4 is also referred to as a first electrode film and serves a floating gate electrode in memory-cell transistor Trm. Polycrystalline silicon films 6 and 7 are also referred to as a second electrode film and a third electrode film respectively. Tungsten nitride film 8 is one example of a barrier metal film and tungsten film 9 is one example of a metal film. Polycrystalline silicon films 6 and 7, tungsten nitride film 8, and tungsten film 9 serve as a control gate electrode which may also be referred to as a word line. Interelectrode insulating film 5 may take an ONO structure comprising a stack of oxide/nitride/oxide films, which may be provided with additional bottom and top nitrides to take a NONON structure, or may also comprise a high dielectric constant insulating film.

In the surface layer of silicon substrate 2 located between gate electrodes MG and between gate electrodes SG and MG, source/drain regions 2a are formed. In the surface layer of silicon substrate 2 located between gate electrodes SG, drain region 2b is formed as can be seen on the right side of gate electrode SG of FIG. 3A.

Select gate electrode SG of select transistor Trs is substantially identical in structure to gate electrode MG of memory-cell transistor Trm and thus, is configured by polycrystalline silicon film 4, interelectrode insulating film 5, polycrystalline silicon films 6 and 7, tungsten nitride (WN) film 8, and tungsten (W) film 9 stacked in the listed sequence above first gate insulating film 3. Silicon nitride film 10 is further formed above tungsten film 9. Select gate electrode SG differs from memory cell gate electrode MG in that opening 5a, having width W, is formed in the central portion of polycrystalline silicon film 6 and interelectrode insulating film 5 and recess 4a is formed in polycrystalline silicon film 4.

Polycrystalline silicon film 7 is formed so as to fill recess 4a and opening 5a, and further cover the upper surface of polycrystalline silicon film 6. Thus, polycrystalline silicon film 7 is rendered electrically conductive with polycrystalline silicon film 4 through opening 5a.

Polycrystalline silicon film 7 located above polycrystalline silicon film 6 is configured at thickness T which is less than ½ of width W of opening 5a. The upper surface of polycrystalline silicon film 7 may be slightly stepped in the portion located above recess 4a but is substantially planar. Thus, thickness of tungsten nitride film 8, located above polycrystalline silicon film 7, is substantially even and the profile of tungsten nitride film 8 is substantially planar in the portion located above recess 4a.

Referring now to FIG. 3B, a description will be given on the structure of peripheral circuit transistor Trp. Transistor Trp is substantially identical in structure to select transistor Trs. In peripheral circuit transistor Trp, silicon substrate 2 serves as element region Saa being surrounded by element isolation region Sbb. Above the upper surface of silicon substrate 2, gate insulating film 3 is formed and a thickness of the gate insulating film 3 may depend upon the type of transistor Trp. For instance, a thick gate insulating film 3 may be formed in peripheral circuit transistor trp which requires high level of voltage tolerance. Gate electrode PG is formed above first gate insulating film 3.

Gate electrode PG of transistor Trp is configured by polycrystalline silicon film 4, interelectrode insulating film 5, polycrystalline silicon films 6 and 7, tungsten nitride film (WN) 8, and tungsten (W) film 9 stacked in the listed sequence above first gate insulating film 3. Silicon nitride film 10 is further formed above tungsten film 9. Gate electrode PG is provided with opening 5b formed in the central portion of polycrystalline silicon film 6 and interelectrode insulating film 5 and recess 4a is formed in polycrystalline silicon film 4. Opening 5b is configured at width WP which is greater than width W of opening 5a. The gate width of peripheral circuit transistor Trp is often greater than the gate width of select transistor Trs. Thus, by increasing the width of opening 5b of peripheral circuit transistor Trp to the gate width, the contact resistance between polycrystalline silicon film 7 and polycrystalline silicon film 4 can be reduced. Polycrystalline silicon film 7 located above polycrystalline silicon film 6 is formed so as to overfill opening 5b and recess 4b and is electrically conductive with polycrystalline silicon film 4. Polycrystalline silicon film 7 is stepped at a location corresponding to the steps of opening 5b and recess 4b.

As shown in FIGS. 3A and 3B, the step of tungsten nitride film (WN) 8 of select transistor Trs is smaller than the step of tungsten nitride film (WN) 8 of peripheral circuit transistor Trp. Polycrystalline silicon film 7 located above polycrystalline silicon film 6 is formed at thickness T mentioned earlier, and the portions of polycrystalline silicon film 7 located on sidewalls of opening 5b and recess 4b have thickness D (>T) which is greater than thickness T so as to be gradually stepped. In other words, an inclination of descending portion of polycrystalline silicon film 7 along opening 5b is more gradual as compared to an inclination of polycrystalline silicon film 6 or interelectrode insulating film 5 exposed by the opening 5b. Further, the inclination of a descending portion of polycrystalline silicon film 7 is more gradual as compared to an inclination of recess 4b formed of polycrystalline silicon film 4 exposed by opening 5b. As a result, tungsten nitride film 8 overlying polycrystalline silicon film 7 is gently stepped above opening 5b and is formed in a substantially even thickness.

According to the above described structure, the thinned polycrystalline silicon films 6 and 7 reduces the aspect ratio of the resulting gate structure. As for gate electrode MG of memory-cell transistor Trm, word line resistance can be reduced since tungsten nitride film 8 and tungsten film 9 are stacked above thinned polycrystalline silicon films 6 and 7.

Next, one example of a manufacturing process flow for obtaining the structure illustrated in FIGS. 3A and 3B will be described with reference to FIGS. 4 to 9. The following descriptions will focus on the features according to one embodiment and thus, known steps may be added or removed from the process flow as required. Further, the sequence of the process flow may be rearranged if practicable.

Figure 4:
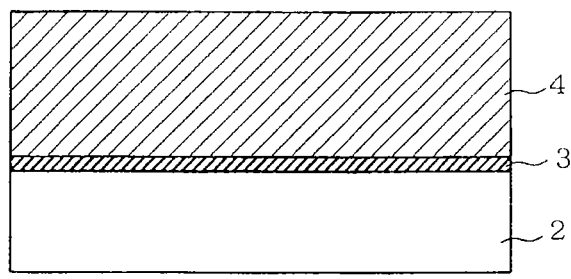

Referring to FIG. 4, gate insulating film 3 is formed above the upper surface of silicon substrate 2. Gate insulating film 3 may comprise a silicon oxide film of a predetermined thickness formed by methodologies such as thermal oxidation. Polycrystalline silicon film 4 is further formed above gate insulating film 3. Then, though not shown, a hard mask typically formed of a silicon nitride film is formed above polycrystalline silicon film 4, whereafter etching progresses through polycrystalline silicon film 4, gate insulating film 3, and partially into silicon substrate 2 to define an element isolation trenches of a predetermined depth. The element isolation trenches are filled with an element isolation insulating film to obtain element isolation regions Sb. As a result, element regions Sa isolated by element isolation regions Sb are formed in the surface portion of silicon substrate 2. At the same time, element isolation region Sbb is formed in the peripheral circuit region to form element region Saa in silicon substrate 2.

Figure 5:
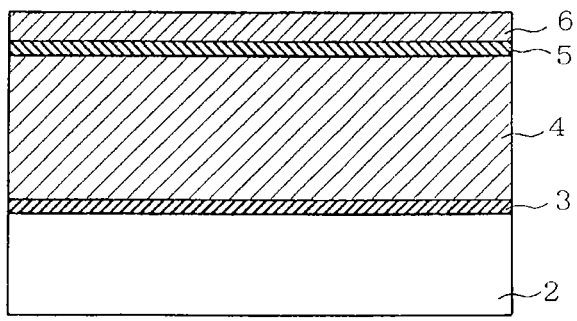

Next, referring to FIG. 5, interelectrode insulating film 5 is formed above the upper surface of polycrystalline silicon film 4. Interelectrode insulating film 5 may comprise an ONO (oxide-nitride-oxide) film or NONON (nitride-oxide-nitride-oxide-nitride) film. Then, polycrystalline silicon film 6 of a predetermined thickness is formed above the upper surface of interelectrode insulating film 5 and element isolation insulating film Sb. Polycrystalline silicon film 6 is also referred to as a second electrode film.

Figure 6:
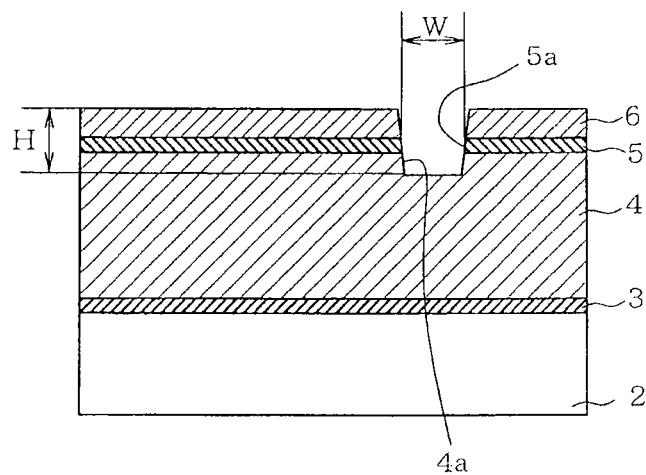

Next, as shown in FIG. 6, opening 5a and recess 4a are formed by photolithography in a location where gate electrode SG of select transistor Trs is to be formed. More specifically, polycrystalline silicon film 6 and interelectrode insulating film 5 are etched by RIE (Reactive Ion Etching) to form opening 5a having a predetermined width W and polycrystalline silicon film 4 is further etched by RIE to form recess 4b. As a result, a trench comprising opening 5a and recess 4a is formed which has depth H. Depth H is a measurement taken from the upper surface of polycrystalline silicon film 6 to the bottom surface of recess 4a. After the etching, the surfaces of polycrystalline silicon film 6, opening 5a, and recess 4a may be cleaned.

Next, as shown in FIG. 7A, polycrystalline silicon film 7a is formed so as to overfill recess 4a and opening 5a such that thickness of polycrystalline silicon film 7a located above the upper surface of polycrystalline silicon film 6 measures a predetermined thickness of T0. Thickness T0 of polycrystalline silicon film 7a is controlled so as to be greater than ½ of width W of opening 5a (T0>W/2). For example, when width W of opening 5a is 40 to 50 nm, thickness of polycrystalline silicon film 7a is controlled to be greater than 20 to 25 nm and preferably 35 nm or greater. Polycrystalline silicon film 7a may be controlled to range from 60 to 70 nm when width W of opening 5a takes the foregoing range in consideration of process capability. The upper surface of the resulting polycrystalline silicon film 7a is slightly stepped at the location corresponding to the trench as indicated by step 7b in FIG. 7A. However, dimension h of step 7b is much smaller than depth H of the trench and is 10 nm or less, for example.

In the structure shown in FIG. 7B, on the other hand, width WP of opening 5b is controlled so as to be greater than thickness T0 of polycrystalline silicon film 7a. As a result, a recess is formed in the upper portion of polycrystalline silicon film 7a which corresponds to recess 4b. Further, the edge of recess 4b is sloped and is more gradual compared to the inclination of polycrystalline silicon film 6 or interelectrode insulating film 5 exposed by opening 5b.

Next, as shown in FIG. 8A, polycrystalline silicon film 7a is etched back to thin polycrystalline silicon film 7a to thickness T. As mentioned earlier, thickness T is equal to or less than ½ of width W of opening 5a (T≤W/2). The slight step 7b generated during the formation of polycrystalline silicon film 7a may remain after polycrystalline silicon film 7a is etched back by RIE as shown in FIG. 8A. However, the dimension h of the step remaining in polycrystalline silicon film 7 after the etch back is substantially identical to the dimension of the step existing when polycrystalline silicon film 7a was formed. Thus, step 7b in FIG. 8A is identified as step 7b in FIG. 7A. As a result, polycrystalline silicon film 7 overfilling opening 5a and recess 4a so as to reside above polycrystalline silicon film 6 exhibits a substantially flat upper surface.

In the structure shown in FIG. 8B, on the other hand, a thick polycrystalline silicon film 7, having width D greater than thickness T, remains in the portion located on the sidewalls of opening 5b after the etch back. The upper surface of this thick portion of polycrystalline silicon film 7 located on the sidewalls of opening 5b descends gradually like a spacer. The upper surface of the thick portion of silicon film 7 is sloped and is more gradually compared to the inclination of polycrystalline silicon film 6 or interelectrode insulating film 5 exposed by opening 5b.

Figure 9:
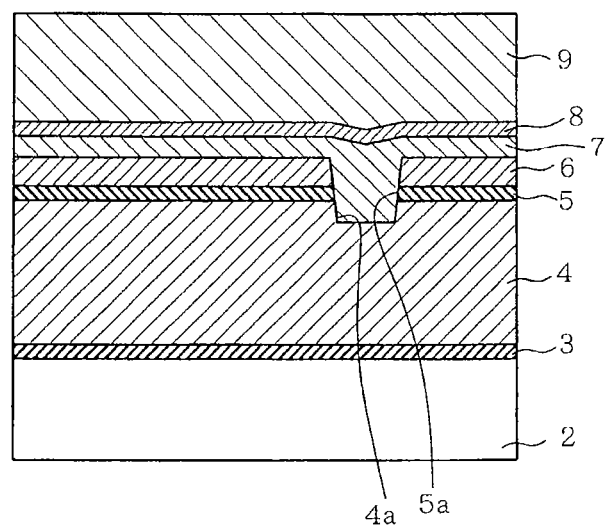

Next, as shown in FIG. 9, tungsten nitride film 8 and tungsten film 9 are sputtered above the upper surface of polycrystalline silicon film 7. Tungsten nitride film 8 serves as a barrier metal film. Because the upper surface of polycrystalline silicon film 7 is substantially flat or planar, tungsten nitride film 8 is formed substantially at even thickness without step disconnection which is a disconnection of film encountered over a stepped structure. As a result, tungsten film 9 can be formed over tungsten nitride film 8 to prevent reaction occurring from direct contact between tungsten film 9 and polycrystalline silicon film 7.

Next, as shown in FIG. 3A, silicon nitride film 10 is formed above the upper surface of tungsten film 9 which is followed by gate patterning to obtain the gate structures of gate electrodes MG and SG. The gate patterning isolates gate electrodes MG and gate electrode SG by etching tungsten film 9, tungsten nitride film 8, and polycrystalline silicon films 7 and 6, interelectrode insulating film 5, and polycrystalline silicon film 4 by RIE using silicon nitride film 10 as a hard mask. After the gate patterning, impurities are introduced into the surface of silicon substrate 2 located between gate electrodes MG and SG by ion implantation to form diffusion regions 2a and 2b.

Similar gate patterning is carried out in the peripheral circuit region to obtain gate electrode PG structured as shown in FIG. 3B. Because width of opening 5b formed through interelectrode insulating film 5 and polycrystalline silicon film 6 is wider compared to opening 5a of select gate electrode SG, a recess corresponding to recess 4b is generated in tungsten nitride film 8 with the formation of polycrystalline silicon film 7a. The recess of tungsten nitride film 8 is deeper than dimension h of step 7b of select gate electrode SG. However, the upper surface of polycrystalline silicon film 7 located along the sidewalls of opening 5b can be sloped and is more gradual compared to the inclination of polycrystalline silicon film 6 or interelectrode insulating film 5 exposed by opening 5b. Further, because the polycrystalline silicon film 6 in the portion on the sidewalls of opening 5b has a gradually descending spacer-like portion, polycrystalline silicon film 6 has width D greater than thickness T. Though not shown, interlayer insulating film is blanketed above gate electrodes MG and SG, whereafter contact and other features are formed to obtain NAND flash memory device 1.

In the first embodiment, it is possible to suppress occurrence of step(s) on the upper surface of polycrystalline silicon film 7 originating from recess 4a, because the polycrystalline silicon film 7a is thicker than ½ of the width W of opening 5a formed above the upper surface of polycrystalline silicon film 6. Further, the formed polycrystalline silicon film 7a was etched back so as to be thinned to ½ or less than width W of opening 5a to obtain polycrystalline silicon film 7 serving as a third electrode film. This improves the planarity or flatness of polycrystalline silicon film 7 as compared to forming polycrystalline silicon film 7 to thickness T without the etch back process. Further, tungsten nitride film 8 serving as a barrier metal film can be formed over polycrystalline silicon film 7 at an even thickness without disconnection above a recess portion.

As a result, it is possible to prevent problems occurring from the use of thin polycrystalline silicon films 6 and 7 serving as a control gate electrode overlying interelectrode insulating film 5 and from the provision of tungsten film 9, i.e., metal film above polycrystalline silicon films 6 and 7. Further, thinning polycrystalline silicon films 6 and 7 allows gate patterning to be carried out under reduced aspect ratio.

FIGS. 10A to 16 illustrate a second embodiment. Differences from the first embodiment will be discussed hereinafter.

Figure 10A:
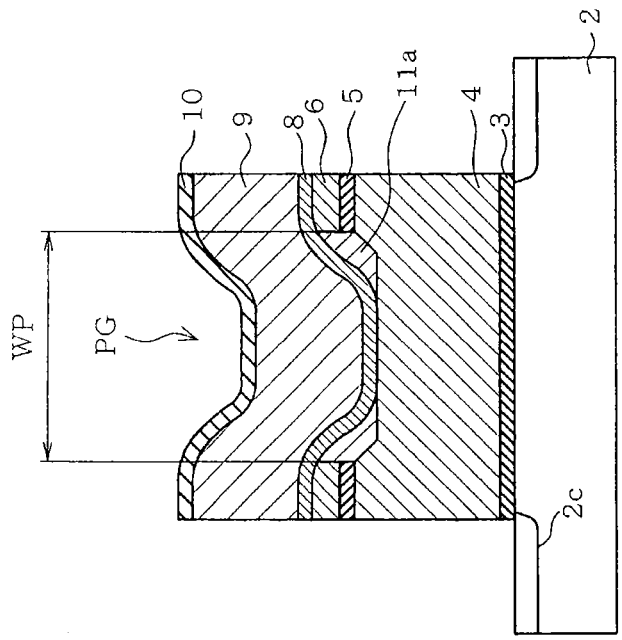
FIGS. 10A and 10B illustrate a second embodiment, where

In the second embodiment, polycrystalline silicon film 7 is replaced by polycrystalline silicon film 11 in gate electrode SG of select transistor Trs as shown in FIG. 10A. More specifically, polycrystalline silicon film 11 fills opening 5a and recess 4a but is removed from the upper surface of polycrystalline silicon film 6. In FIG. 10A, the central portion of the upper surface of polycrystalline silicon film 11 residing in opening 5a and recess 4a has a small step of dimension h. The dimension of this small step is substantially equal to the dimension of the step described in the first embodiment and thus, it does not become an impediment in the formation of the overlying tungsten nitride film 8.

Figure 10B:
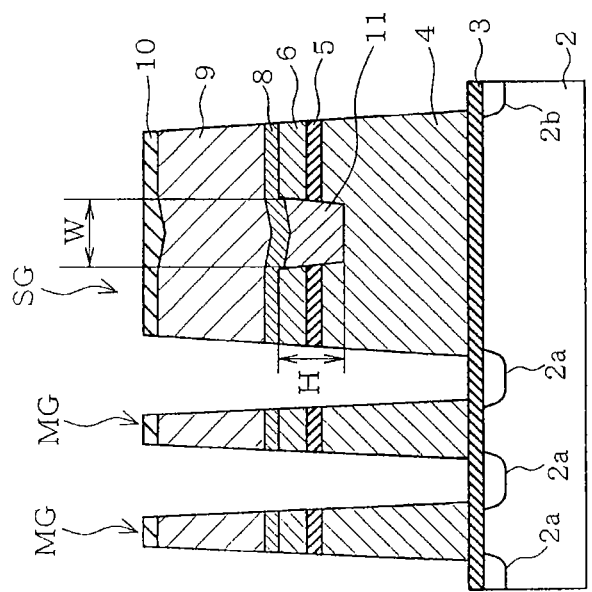

FIG. 10B illustrates gate electrode PG of peripheral circuit transistor Trp. As shown, polycrystalline silicon film 11a partially remains inside opening 5b and recess 4b. Polycrystalline silicon film 11a remains in a spacer-like shape along the sidewalls of opening 5b as the result of etch back and thus, is inclined or sloped more gradually as compared to an inclination of polycrystalline silicon film 6 or interelectrode insulating film 5 exposed by the opening 5b. As a result, tungsten nitride film 8 can be formed at an even thickness above polycrystalline silicon film 11a without disconnections above a recess portion. Tungsten nitride film 8 is configured to be in direct contact with polycrystalline silicon film 4.

Next, the manufacturing process flow of the above described structure will be described, focusing on the differences from the first embodiment.

The structure illustrated in FIG. 5 is obtained by pursuing the process flow of the first embodiment. As shown, gate insulating film 3, polycrystalline silicon film 4, interelectrode insulating film 5, and polycrystalline silicon film 6 are stacked in the listed sequence above silicon substrate 2.

Figure 11:
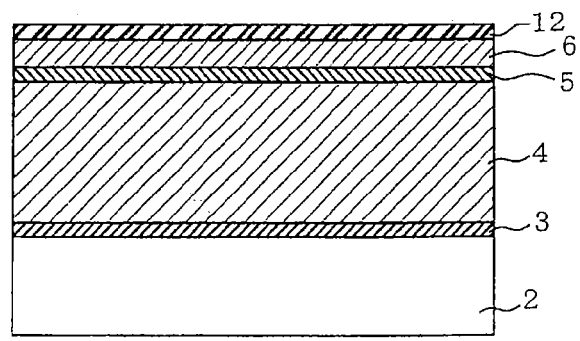
FIGS. 11, 12, 13, 14A, 14B, 15, and 16 each illustrate one phase of the manufacturing process flow; where FIGS. 11, 12, 13, 14A, 15, and 16 each illustrate one schematic example of a vertical cross-sectional view taken along line 3A-3A of FIG. 2A.

As shown in FIG. 11, silicon oxide film 12 is formed in a predetermined thickness above the upper surface of polycrystalline silicon film 6. Silicon oxide film 12 may be formed by thermally oxidizing polycrystalline silicon film 5 or by deposition such as CVD (Chemical Vapor Deposition). Silicon oxide film 12 is used in the gate patterning.

Figure 12:
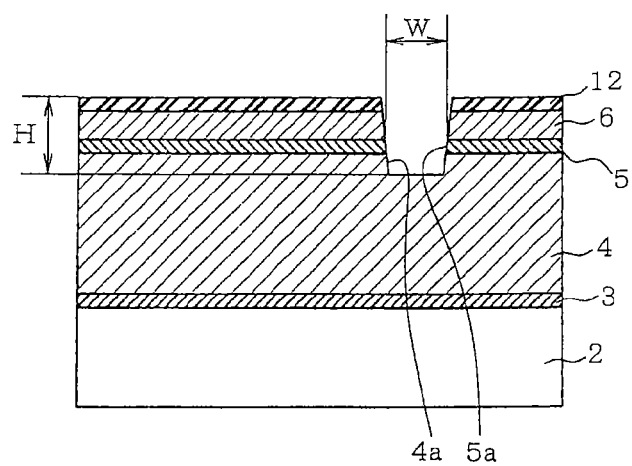

Next, as shown in FIG. 12, opening 5a and recess 4a are formed by photolithography in a location where gate electrode SG of select transistor Trs is to be formed. As a result, a trench comprising opening 5a and recess 4a is formed which has depth H. Depth H is a measurement taken from the upper surface of polycrystalline silicon film 6 to the bottom surface of recess 4a. As described in the first embodiment, polycrystalline silicon film 6 and interelectrode insulating film 5 are etched by RIE to form opening 5a having a predetermined width W and polycrystalline silicon film 4 is further etched by RIE to form recess 4a. After the etching, the surfaces of silicon oxide film 12, opening 5a, and recess 4a may be cleaned.

Figure 13:
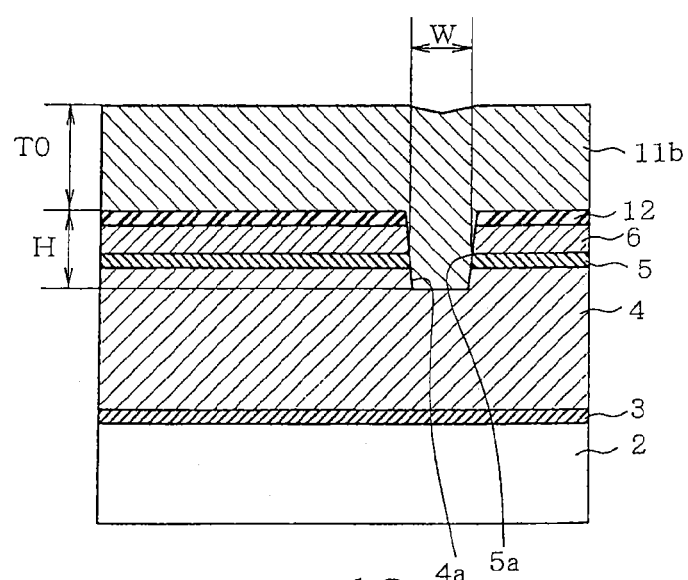

Next, as shown in FIG. 13, polycrystalline silicon film 11a is formed so as to overfill opening 5a and recess 4a such that thickness of polycrystalline silicon film 11a above the upper surface of polycrystalline silicon film 6 measures a predetermined thickness of T0. Thickness T0 of polycrystalline silicon film 11a is controlled to be greater than ½ of width W of opening 5a (T0>W/2). Thickness of polycrystalline silicon film 11a is controlled under the conditions applied in the first embodiment. The portion of the upper surface of polycrystalline silicon film 11 disposed above the upper surface of recess 4a may be slightly stepped by dimension h which may be 10 nm or less and thus, significantly smaller than depth H of the trench.

Figure 14A:
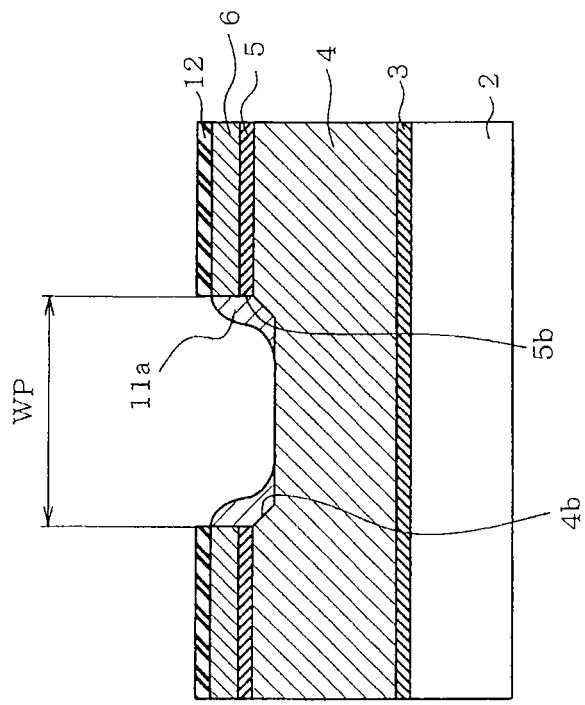

Next, as shown in FIG. 14A, polycrystalline silicon film 11a located above silicon oxide film 12 is etched back and removed. The etching further progresses to lower the upper surface of polycrystalline silicon film 11 remaining inside opening 5a and recess 4a so as to be slightly below the upper surface of polycrystalline silicon film 6. Using silicon oxide film 12 as a stopper, polycrystalline silicon film 11a is selectively etched back such that no polycrystalline silicon film 11 remains above silicon oxide film 12. As a result, polycrystalline silicon film 11 remains inside opening 5a and recess 4a with a substantially planar upper surface.

Figure 14B:
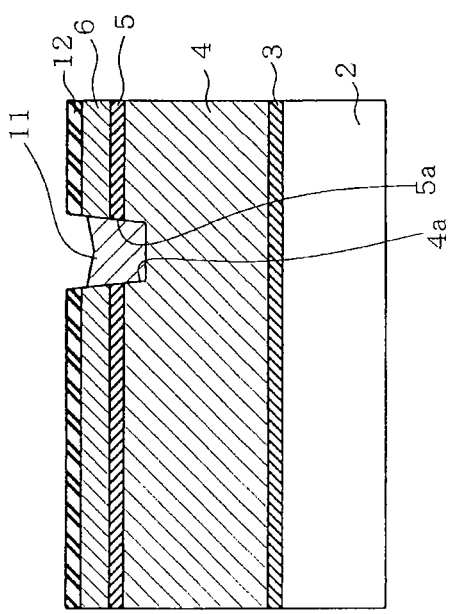

In the structure shown in FIG. 14B, on the other hand, thick polycrystalline silicon film 11a remains along the sidewalls of opening 5b. The upper surface of polycrystalline silicon film 11a located along the sidewalls of opening 5b descends gradually like a spacer so as to be sloped and is sloped more gradually compared to the inclination of polycrystalline silicon film 6 or interelectrode insulating film 5 exposed by opening 5b.

Figure 15:
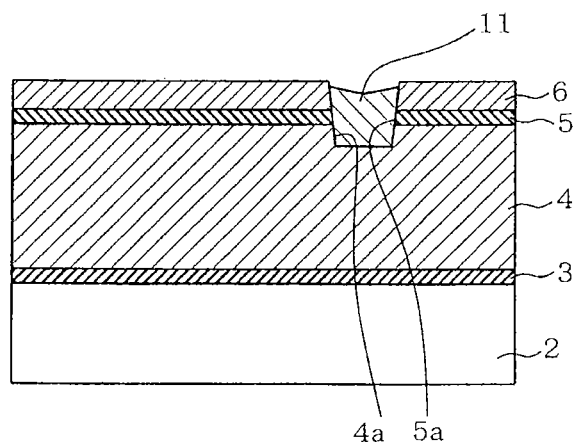

Next, as shown in FIG. 15, a post etch-back cleaning may be carried out to remove particles on surfaces and to remove silicon oxide film 12 by dilute hydrofluoric acid or the like.

Figure 16:
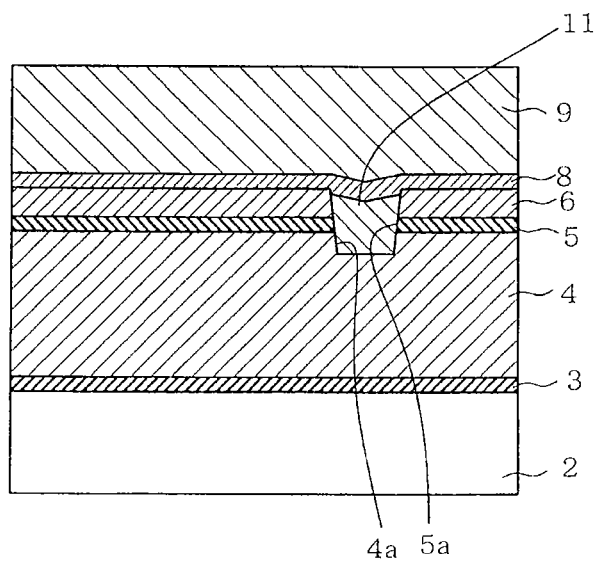

Then, as shown in FIG. 16, tungsten nitride film 8 and tungsten film 9 are sputtered consecutively above the upper surface of polycrystalline silicon films 6 and 7.

Tungsten nitride film 8 serving as a barrier metal film is formed at even thickness without step disconnection since the upper surface of polycrystalline silicon film 11 is substantially planar. Thus, As a result, tungsten film 9 can be formed over tungsten nitride film 8 to prevent reaction occurring from direct contact between tungsten film 9 and polycrystalline silicon film 7.

Then, as shown in FIG. 10A, silicon nitride film 10 is formed above the upper surface of tungsten film 9 as was the case in the first embodiment which is followed by gate patterning to obtain the gate structures of gate electrodes MG and SG. Then, impurities are introduced into the surface of silicon substrate 2 located between gate electrode MG and SG by ion implantation to form diffusion regions 2a and 2b.

Similar gate patterning is carried out in the peripheral circuit region to obtain gate electrode PG structured as shown in FIG. 10B. Etch back of polycrystalline silicon film 11a is carried out to the extent to expose silicon oxide film 12. Thus, inside opening 5b and recess 4b, polycrystalline silicon film 11a is removed with the exception of the spacer-like portions remaining along the sidewalls of opening 5b and recess 4b to thereby expose the upper surface of polycrystalline silicon film 4. Though not shown, the structures shown in FIGS. 10A and 10B are further subjected to formation of interlayer insulating film, contact plugs, and wiring layers to obtain NAND flash memory device 1.

The second embodiment provides effects similar to those of the first embodiment. Additionally, since polycrystalline silicon film 11 is not formed above polycrystalline silicon film 6, the height of the features can be lowered which in turn reduces the aspect ratio to be achieved in the gate patterning.

Further, polycrystalline silicon film 11a is etched back using silicon oxide film 12 as a stopper. Thus, polycrystalline silicon film 11a above silicon oxide film 12 can be removed. It is possible to keep the target thickness of polycrystalline silicon film 6 without requiring further adjustments. In other words, polycrystalline silicon film 6 can be controlled to a thickness that maximizes the performance of the memory cell transistors Trm. Thus, electrical properties of memory cell transistor Trm can be stabilized by controlling the thickness of polycrystalline silicon film 6

The above described manufacturing process flow may be modified to eliminate the formation of silicon oxide film 12. This means that polycrystalline silicon film 11b above polycrystalline silicon film 6 needs to be etched back without silicon oxide film 12 serving as an etch stopper. However, the structure of FIG. 10A can be obtained through control of other parameters of the etch recipe such as etch time.

Further, in obtaining the structure illustrated in FIG. 10A in the absence of silicon oxide film 12, polycrystalline silicon film 6 may be preemptively formed at a thickness greater than the target thickness. The thickness can be obtained by etching back polycrystalline silicon film 6 after etching back and removing polycrystalline silicon film lib.

Third Embodiment

FIGS. 17A to 19 illustrate a third embodiment. Differences from the first embodiment will be described hereinafter.

In the third embodiment, gate electrode SG is provided with polycrystalline silicon film 7c instead of polycrystalline silicon film 7 of the first embodiment. Polycrystalline silicon film 7c of the third embodiment is planar and is free of steps compared to polycrystalline silicon film 7 of the first embodiment. As shown in FIG. 17B, gate electrode PG is also provided with a planar polycrystalline silicon film 7c.

Thus, tungsten nitride film 8 can be formed above the upper surface of polycrystalline silicon film 7c at even thickness without step disconnections in both gate electrodes SG and PG.

Next, the manufacturing process flow of the above described structure will be described focusing on the differences from the first embodiment. The structure illustrated in FIGS. 7A and 7B is obtained by pursuing the process flow of the first embodiment. More specifically, polycrystalline silicon film 7c is formed so as to overfill opening 5a and recess 4a such that thickness of polycrystalline silicon film 7a above the upper surface of polycrystalline silicon film 6 measures a predetermined thickness of T0. Thickness T0 of polycrystalline silicon film 7a is controlled so as to be greater than ½ of width W of opening 5a (T0>W/2). The portion of the upper surface of polycrystalline silicon film 7a situated in a location corresponding to recess 4a is slightly stepped by dimension h.

Next, as shown in FIG. 18A, the upper surface of polycrystalline silicon film 7c is planarized by CMP (Chemical Mechanical Polishing) instead of the etch back performed in the first embodiment. Thus, a predetermined amount of polycrystalline silicon film 7c is polished away to thin polycrystalline silicon film 7c to thickness T. Thickness T is equal to or less than ½ of width W of opening 5a (T≤W/2). Planarization by CMP achieves a substantially planar surface across the upper surface of polycrystalline silicon film 7c and thus, no steps are formed. CMP is followed by post-CMP cleaning.

The structure illustrated in FIG. 18B also achieves a substantially planar surface across the upper surface of polycrystalline silicon film 7c.

As shown in FIGS. 18A and 18B, polycrystalline silicon film 7c may be configured to remain above polycrystalline silicon film 6 or may be removed as in the second embodiment. Alternatively, polycrystalline silicon film 6 may be preemptively formed at a thickness greater than the desired thickness so that the target thickness can be obtained by polishing polycrystalline silicon film 6.

Figure 19:
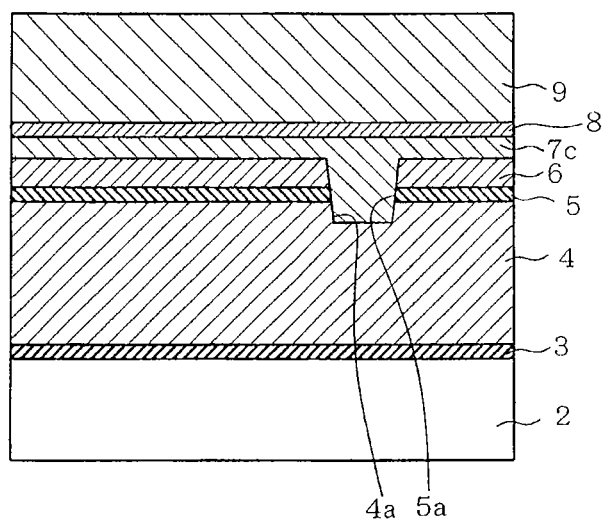

Next, as shown in FIG. 19, tungsten nitride film 8 and tungsten film 9 are sputtered in the listed sequence above the upper surface of polycrystalline silicon film 7c. Tungsten nitride film 8 serves as a barrier metal film. Because the upper surface of polycrystalline silicon film 7c is substantially planar, tungsten nitride film 8 is formed substantially at even thickness without step disconnection. As a result, tungsten film 9 can be formed over tungsten nitride film 8 to prevent reaction occurring from direct contact between tungsten film 9 and polycrystalline silicon film 7.

Figure 17A:
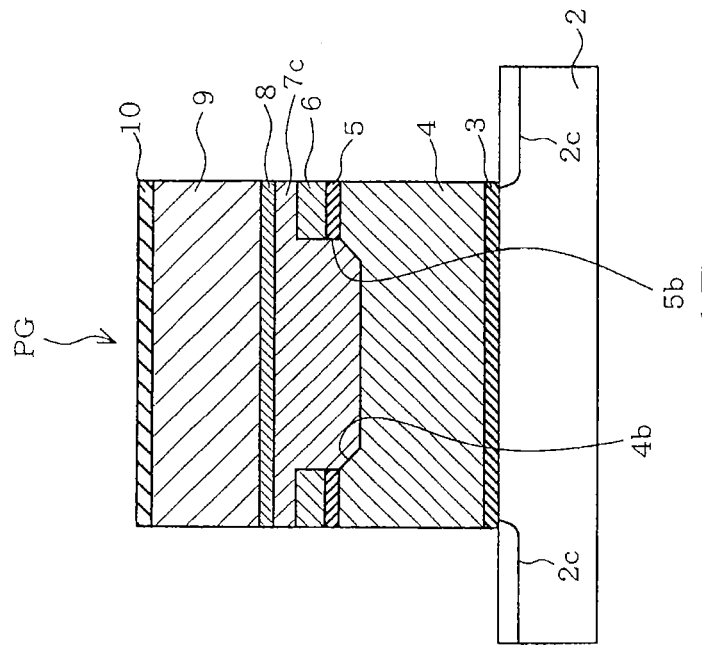
FIGS. 17A and 17B illustrate a third embodiment, where
Figure 17B:
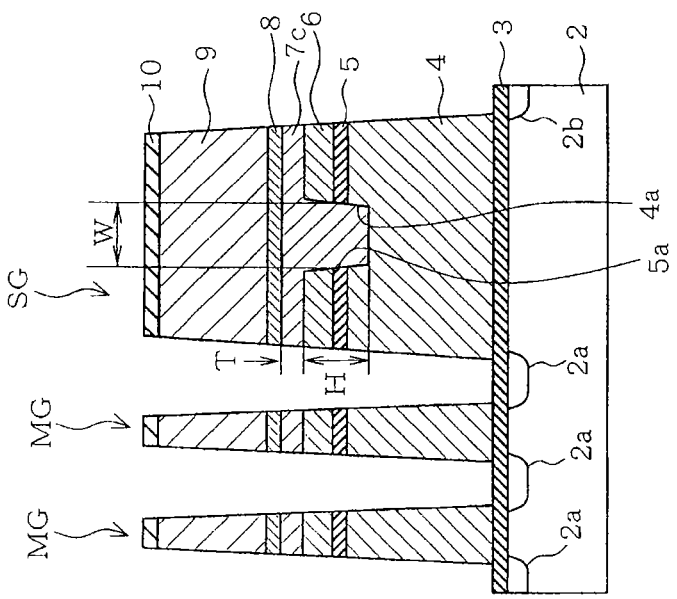

Next, as shown in FIGS. 17A and 17B, silicon nitride film 10 is formed above the upper surface of tungsten film 9 which is followed by gate patterning to obtain the gate structures of gate electrodes MG and SG. After the gate patterning, impurities are introduced into the surface of silicon substrate 2 located between gate electrodes MG and SG by ion implantation to form diffusion regions 2a and 2b. Similar process flow is pursued in the peripheral circuit region to obtain the structure illustrated in FIG. 17B.

The third embodiment provides effects similar to those of the first embodiment. Additionally, polycrystalline silicon film 7c is planarized to thickness T by CMP and thus, the planarity of the upper surface of polycrystalline silicon film 7c can be improved even more as compared to the first embodiment.

Fourth Embodiment

Figure 20:
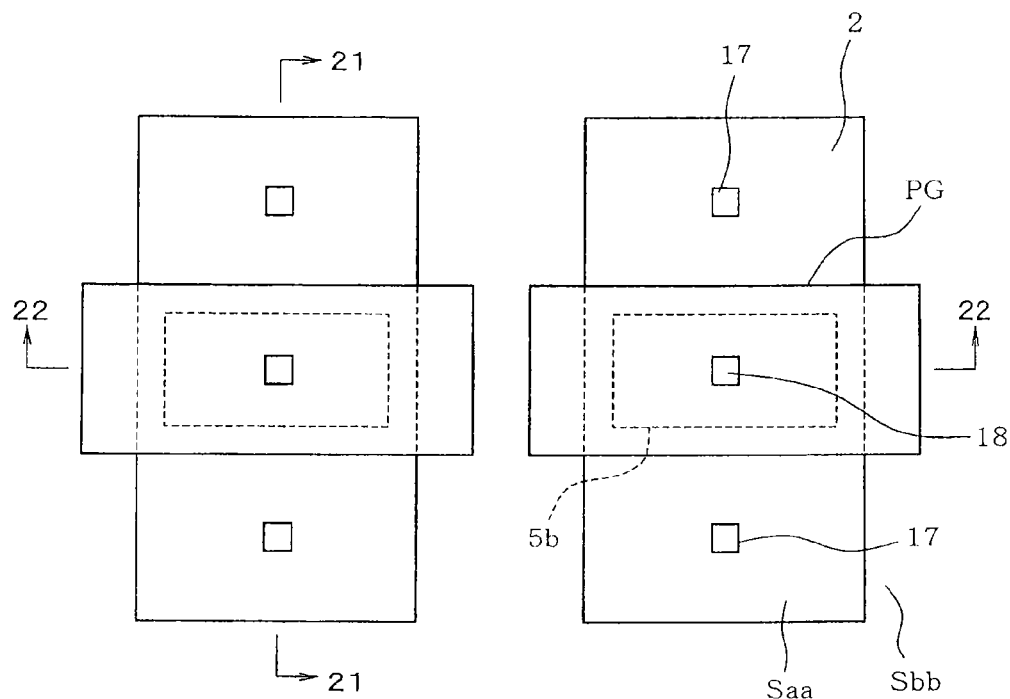
FIG. 20 illustrates a fourth embodiment and is one schematic example of a plan view of a peripheral circuit transistor.
Figure 21:
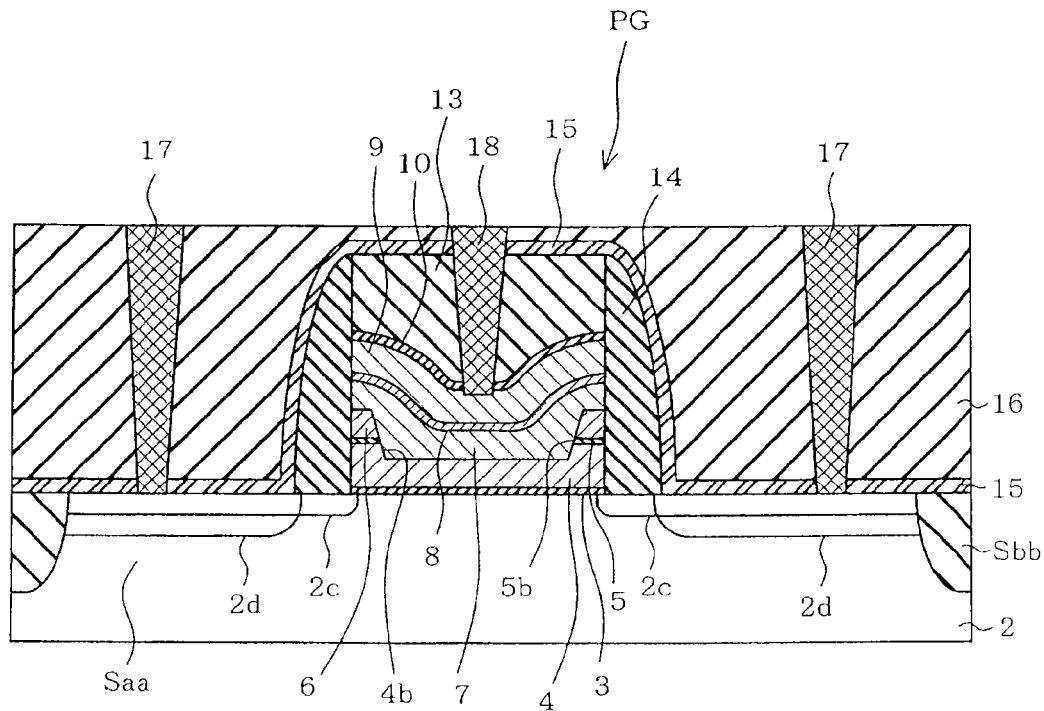
FIG. 21 is one schematic example of a vertical cross sectional view taken along line 21-21 of FIG. 20.
Figure 22:
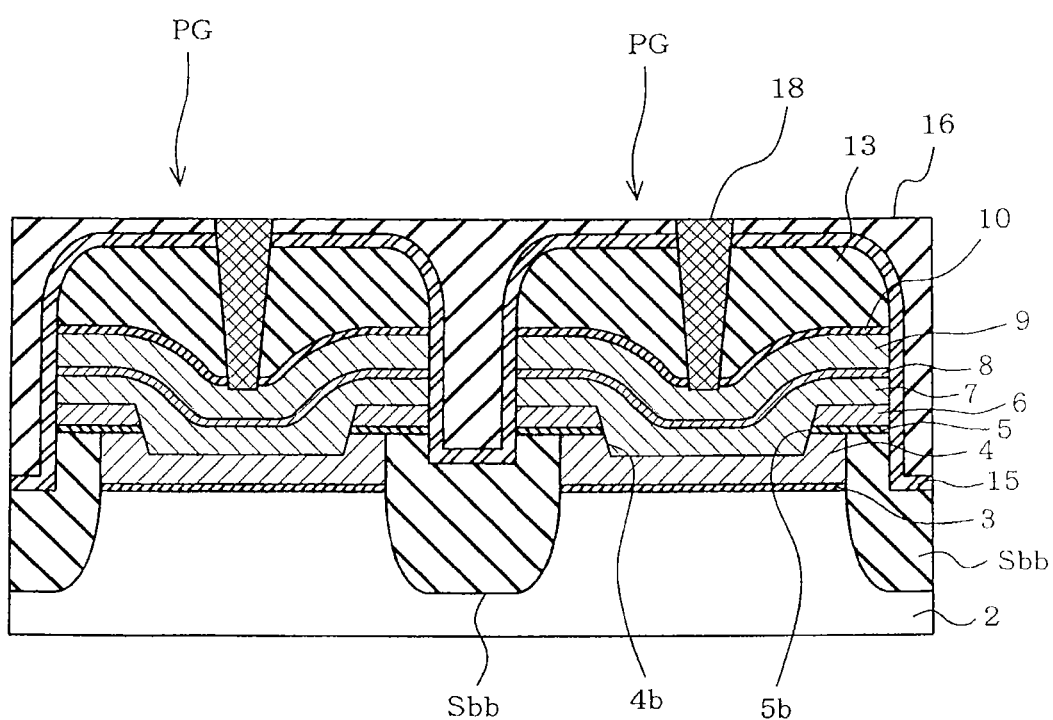
FIG. 22 is one schematic example of a vertical cross sectional view taken along line 22-22 of FIG. 20.

FIGS. 20 to 22 illustrate a fourth embodiment. Differences from the first embodiment will be described hereinafter. In the first embodiment, gate contact 18 to gate electrode PG is located on the element isolation film. In the fourth embodiment, gate contact 18 is located above opening 5b.

FIG. 20 is one example of a planar layout of a couple of peripheral circuit transistors Trp. As can be seen in FIG. 20, gate electrode PG extends across the central portion of rectangular element region Saa which is surrounded by element isolation film Sbb. In element region Saa located on both sides of gate electrode PG, a source/drain region is formed which is doped with impurities of a predetermined dopant concentration. Gate electrode PG is provided with opening 5b through a portion of polycrystalline silicon film 6 and interelectrode insulating film 5 located in element forming region Saa. Contact 17 is formed in each of the source/drain regions and gate contact 18 is formed above the central portion of opening 5b.

FIG. 21 is one example of a cross sectional view taken along line 21-21 of FIG. 20 and FIG. 22 is one example of a cross sectional view taken along line 22-22 of FIG. 20. As shown in FIGS. 21 and 22, gate electrode PG comprises gate insulating film 3, polycrystalline silicon film 4, interelectrode insulating film 5, polycrystalline silicon films 6 and 7, tungsten nitride film 8, tungsten film 9, silicon nitride film 10, and silicon oxide film 13.

Opening 5b occupies most of interelectrode insulating film and polycrystalline silicon film 6 of gate electrode PG. FIGS. 21 and 22 shows a predetermined range of interelectrode insulating film 5 and polycrystalline silicon film 6 remaining on both sides of opening 5b. Recess 4b is formed into polycrystalline silicon film 4 below opening 5b. Polycrystalline silicon film 7 is formed so as to overfill opening 5b and recess 4b so as to be located above polycrystalline silicon film 6. The upper surface of polycrystalline silicon film 7 is recessed in the region located inside opening 5b. The central portion of the recess is substantially planar. Polycrystalline silicon film 7 is formed in a spacer-like shape in the portion extending along the sidewalls of opening 5b so as to become thicker as the elevation becomes lower. Such spacer-like shape results from the thick bulk of polycrystalline silicon film 7a being thinned by etch back as described in the first embodiment. Thus, tungsten nitride film 7 and tungsten film 8 can be formed in a substantially even thickness without step disconnections.

Along the sidewalls of gate electrode PG, silicon oxide film 14 is formed. Then, silicon oxide film 15 is blanketed so as to extend along the upper surfaces of gate electrode PG, silicon oxide film 14, source/drain region of silicon substrate 2, and element isolation insulating film Sbb. Interlayer insulating film 16 typically comprising a silicon oxide film is formed in a predetermined thickness so as to bury gate electrode PG. In the source/drain region of silicon substrate 2, impurity diffusion region 2c is formed. Further, heavily concentrated impurity diffusion region 2d is formed in the source/drain region exclusive of the portion masked by silicon oxide film 14 to obtain an LDD (Lightly Doped Drain) structure. Contact 17 extends through interlayer insulating film 16 and silicon oxide film 15 and into the surface layer of source/drain region of silicon substrate 2. Gate contact 18 extends into the central portion of gate electrode PG by penetrating through interlayer insulating film 16, silicon oxide films 17 and 13, and silicon nitride film 10 and further into tungsten film 9. Thus, the bottom portion of gate contact 18 is located inside tungsten film 9.

Next, a description is give on one example of a manufacturing process flow of the above described gate electrode PG. Manufacturing process flow similar to the first embodiment is pursued to obtain a structure similar to FIG. 3. After forming silicon nitride film 10 as shown in FIG. 3, silicon oxide film 14 is formed to define air gaps between gate electrodes MG. Then, silicon oxide film 14 is etched for example by anisotropic etching so as to remain as a spacer only along the sidewalls of select electrodes SG and PG.

Next, silicon oxide film 15 is blanketed, followed by formation of interlayer insulating film 16 to planarize the entire structure. Then, contact holes are formed through interlayer insulating film 16. In the fourth embodiment, the contact holes for contact 17 and gate contact 18 are formed at the same time by RIE.

At this instance, the contact hole of gate contact 18 reaches the upper surface of tungsten film 9 before the contact hole of contact 17. However, by employing an RIE recipe with a higher etch rate for silicon oxide film, tungsten film 9 serves as an etch stop to allow the contact holes for gate contact 18 and contact 17 to be formed simultaneously. An etch recipe with high etch rate for silicon may be employed to ensure formation of contact 17 that extends slightly into silicon substrate 2. A silicon nitride film serving as an etch stop may be formed in the region for forming contact 17. As a result, the silicon nitride film and silicon nitride film 10 maybe used as a first etch stopper in order to improve the controllability of the bottom surface of the contact hole. Then, the contact hole is filled with metal film to form contact 17 and gate contact 18.

In the fourth embodiment, formation of steep steps in the gate structure can be prevented even when a thin polycrystalline silicon film 7 is employed as control gate electrode CG as described in the first to third embodiments. It is possible to prevent disconnections during the formation of tungsten nitride film 8 regardless of the width of opening 5b. For instance, step disconnection of tungsten nitride film 8 in opening 5b causes tungsten film 9 to be in direct contact with polycrystalline silicon film 7. This may result in a void in opening 5b originating from the silicidation of tungsten film 9 by polycrystalline silicon film 7. When a contact hole is formed straight above opening 5b in the presence of such void(s), the bottom of the contact hole may penetrate through gate insulating film 3 and into silicon substrate 2. This phenomenon arises from the simultaneous formation of contact 17 and gate contact 18.

The fourth embodiment prevents occurrence of step disconnections of tungsten nitride film 8 above opening 5b and thus, allows the contact to be located straight above opening 5b without such concerns. As a result, the features can be formed in a smaller area since no extra space needs to be obtained for gate contact 18.

The films located in and above the central portion of opening 5b are substantially planar. For instance, as can be seen in FIG. 21, silicon nitride film 10 located above the central portion of opening 5b is substantially planar. This allows the contact hole to reliably penetrate through silicon nitride film 10, as compared to a structure in which the contact hole lands on a stepped portion of silicon nitride film 10, in which case, the contact hole may not be able to penetrate silicon nitride film 10.

Modified Example of the Fourth Embodiment

Figure 23:
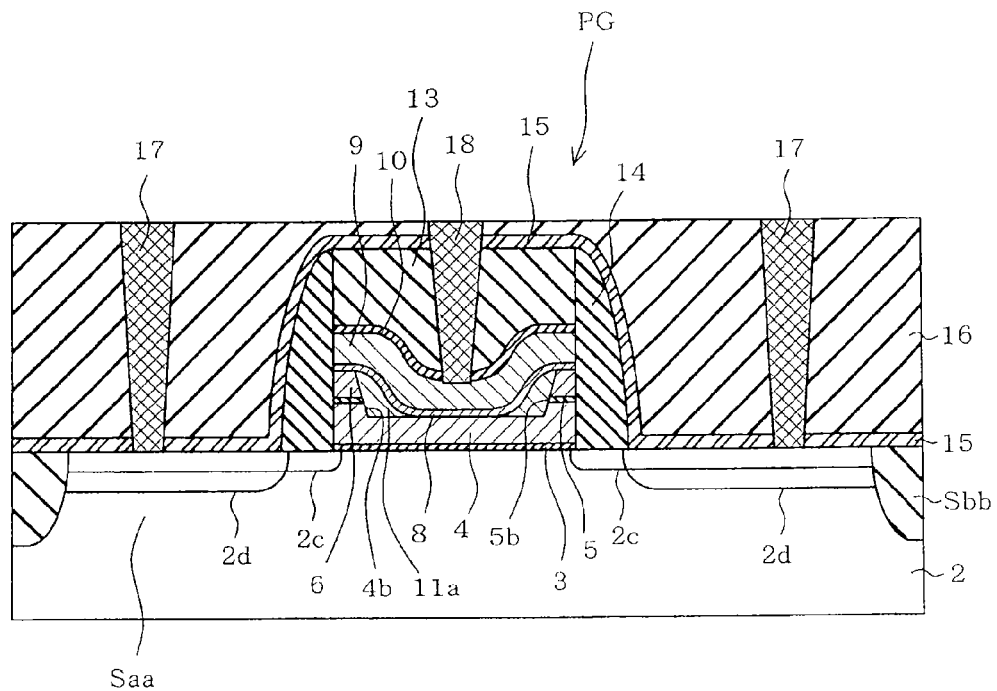
FIG. 23 is a modified example of the fourth embodiment and corresponds to FIG. 21.
Figure 24:
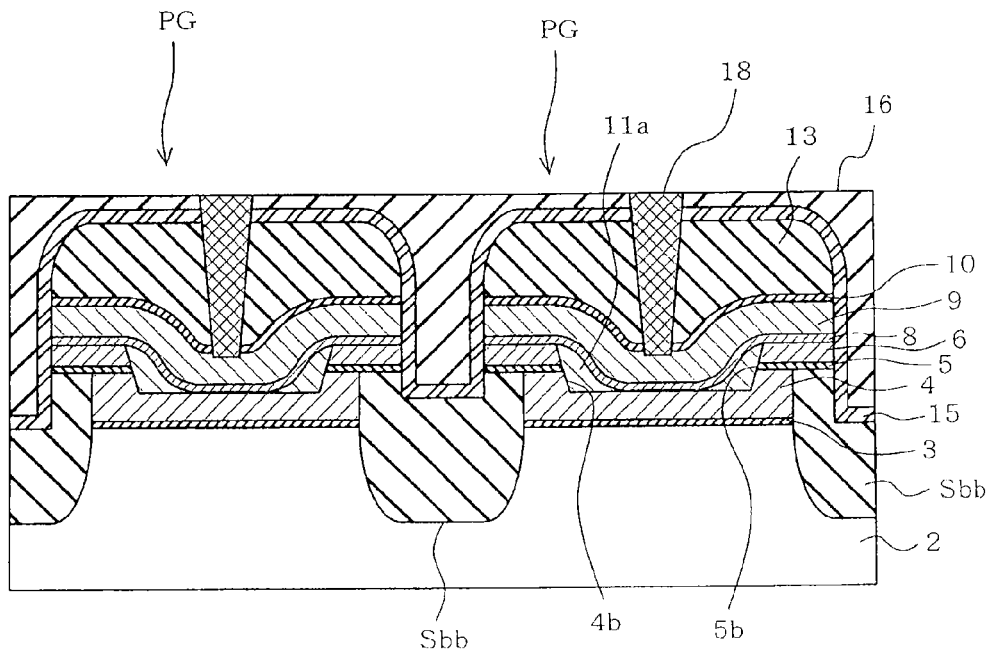
FIG. 24 is another modified example of the fourth embodiment and corresponds to FIG. 22.

The fourth embodiment may be combined with the second embodiment as shown in FIGS. 23 and 24.

Other Embodiments

The foregoing embodiments may be modified as follows.

The first embodiment was described based on an example in which width W of opening 5a was configured to range from 40 to 50 nm and thickness T0 of polycrystalline silicon film 7a was configured to range from 50 to 60 nm. These measurements may be modified as required as long as relation between thickness T0 of polycrystalline silicon film 7a and width W of opening 5a meets T0>W/2 and relation between thickness T of the thinned or etched back polycrystalline silicon film 7 meets T≤W/2.

The upper limit of thickness T0 of polycrystalline silicon film 7a was not given, but in practice, the thickness may be controlled to a given measurement in which the resulting step(s) does cause any negative effects after the etch back. However, any thickness greater than such measurement may be employed depending on process capability.

The amount of polycrystalline silicon film 7 to remain after the etch back may be configured such that the remaining thickness above polycrystalline silicon film 6 is zero as was the case in the second embodiment as long as the above described conditions are met. Further, etch back may continue after the thickness of polycrystalline silicon film 7 becomes zero to thin the underlying polycrystalline silicon film 6 to a predetermined thickness.

The barrier metal film may comprise any material that suppresses reaction between the metal film and the polycrystalline silicon film. Examples of such material other than tungsten nitride (WN), include tungsten silicon nitride (WSiN), titanium nitride (TiN), ruthenium (Ru), ruthenium oxide (RuO), tantalum (Ta), tantalum nitride (TaN), tantalum silicon nitride (TaSiN), manganese (Mn), manganese oxide (MnO), niobium (Nb), niobium nitride (NbN), molybdenum nitride (MoN), and vanadium (Vn).

Accordingly, the combination of metal film and barrier metal film exemplified as tungsten film and tungsten nitride film in the foregoing embodiments may be replaced by various combinations of materials raised above.

The fourth embodiment is not only applicable to the first embodiment but may be applied to the second embodiment and the third embodiment as well.

The embodiments were described through NAND flash memory device 1, but may alternatively be applied to other nonvolatile semiconductor storage devices such as a NOR flash memory device or EEPRROM. Embodiments directed to a single bit memory cell MT and multi-bit memory cell MT both fall within the scope of the application.

The following embodiments also fall within the scope of the present disclosure.

1. A method of forming a nonvolatile semiconductor device comprising forming a first insulating film and a first electrode film in the listed sequence above an upper surface of a semiconductor substrate; forming a second insulating film above the first electrode film; forming a second electrode film above the second insulating film; forming a first trench having a first width and a first depth extending through the second electrode film and the second insulating film and into the first electrode film; forming a third electrode film filling the first trench and overlying the second electrode film, the third electrode film overlying the second electrode film having a first thickness greater than ½ of the first width of the first trench; thinning the third electrode film overlying the second electrode film; and forming a barrier metal film and a metal film in the listed sequence above the third electrode film remaining above the second electrode film and in the first trench.

2. In the method described in 1, thinning the third electrode film comprises an anisotropic etch back.

3. The method described in 1 may further comprise forming an interlayer insulating film covering an upper surface of the metal film, and forming contact straight above the first trench, the contact extending through the interlayer insulating film to contact the metal film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device comprising:
a semiconductor substrate;
a first insulating film disposed above the semiconductor substrate;
a first electrode film disposed above the first insulating film;
a second insulating film disposed above the first electrode film;
a second electrode film disposed above the second insulating film;
a third electrode film filling a first trench and overlying the second electrode film, and the first trench having a first width and a first depth and extending through the second electrode film and the second insulating film and into the first electrode film; and
a first barrier metal film and a first metal film formed in the listed sequence above the third electrode film;
wherein the third electrode film above the second electrode film has a first thickness equal to or less than ½ of the first width of the first trench.

2. The device according to claim 1, wherein a surface of the third electrode film located above the first trench has a step.

3. The device according to claim 1, wherein a surface of the third electrode film located above the first trench is planar.

4. The device according to claim 1, further comprising:
a third insulating film disposed above the semiconductor substrate;
a fourth electrode film disposed above the third insulating film;
a fourth insulating film disposed above the fourth electrode film;
a fifth electrode film disposed above the fourth insulating film;
a sixth electrode film extending along a second trench so as to partially fill the second trench and overlying the fifth electrode film and, the second trench having a second depth and a second width greater than the first width and extending through the fifth electrode film and the fourth insulating film and into the fourth electrode film; and
a second barrier metal film and a second metal film formed in the listed sequence above the sixth electrode film;
wherein the sixth electrode film has the first thickness above the fifth electrode film and above a bottom surface of the second trench, and
wherein a thickness of the sixth electrode film along a sidewall of the fifth electrode film becomes thicker from an upper side to a lower side.

5. The device according to claim 4, further comprising an interlayer insulating film covering an upper surface of the second metal film and a contact disposed above the second trench and extending through the interlayer insulating film and into the second metal film.

6. The device according to claim 5, wherein a central surface of the sixth electrode film located in the second trench is planar.

7. A nonvolatile semiconductor storage device comprising:
a semiconductor substrate;
a first insulating film disposed above the semiconductor substrate;
a first electrode film disposed above the first insulating film;
a second insulating film disposed above the first electrode film;
a second electrode film disposed above the second insulating film;
a third electrode film filling a first trench and, the first trench having a first width and a first depth and extending through the second electrode film and the second insulating film and into the first electrode film; and
a first barrier metal film formed above the second and the third electrode film, and
a first metal film formed above the first barrier metal film.

8. The device according to claim 7, wherein an upper surface of the third electrode film located in an upper portion of the first trench has a step.

9. The device according to claim 7, further comprising an interlayer insulating film covering an upper surface of the first metal film, and a contact extending through the interlayer insulating film and into the first metal film.

10. The device according to claim 7, further comprising:
a third insulating film disposed above the semiconductor substrate;
a fourth electrode film disposed above the third insulating film;
a fourth insulating film disposed above the fourth electrode film;
a fifth electrode film disposed above the fourth insulating film;
a sixth electrode film extending along sidewalls of fifth electrode film and the fourth insulating film in a second trench, a thickness of the sixth electrode film becoming thicker from an upper side to a lower side, and the second trench having the first depth and a second width greater than the first width and extending through the fifth electrode film and the fourth insulating film and into the fourth electrode film; and
a second barrier metal film and a second metal film formed in the listed sequence above the sixth electrode film.

11. The device according to claim 10, wherein the second barrier metal film directly contacts the fourth electrode film.

12. The device according to claim 10, wherein an inclination of the upper surface of the sixth electrode film located in the second trench is more gradual than an inclination of the fifth electrode film and the fourth insulating film exposed by the second trench.

13. A method of forming a nonvolatile semiconductor device, comprising:
forming a first insulating film and a first electrode film in the listed sequence above an upper surface of a semiconductor substrate;
forming a second insulating film above the first electrode film;
forming a second electrode film above the second insulating film;
forming a first trench having a first width and a first depth extending through the second electrode film and the second insulating film and into the first electrode film;
forming a third electrode film filling the first trench and overlying the second electrode film, wherein the third electrode film overlying the second electrode film has a first thickness greater than ½ of the first width of the first trench;
thinning the third electrode film overlying the second electrode film to a second thickness equal to or less than ½ of the first width of the first trench; and
forming a barrier metal film and a metal film in the listed sequence above the thinned third electrode film.

14. The method according to claim 13, wherein thinning the third electrode film comprises an anisotropic etch back.

15. The method according to claim 13, wherein thinning the third electrode film comprises a chemical mechanical polishing.

16. The method according to claim 13, further comprising forming a third insulating film, a fourth electrode film, a fourth insulating film, and a fifth electrode film in the listed sequence, and
wherein forming the first trench includes forming a second trench extending through the fifth electrode film and the fourth insulating film and into the fourth electrode film and having the first depth and a second width greater than the first width, and
wherein forming the third electrode film includes forming a sixth electrode film filling the second trench and overlying the fifth electrode film, wherein the sixth electrode film overlying the fifth electrode film, and the sixth electrode film have the first thickness, and
wherein thinning the third electrode film includes thinning the sixth electrode film overlying the fifth electrode film and located in a central portion of the second trench while leaving the sixth electrode film in the second trench and
wherein forming a barrier metal film and a metal film includes simultaneously forming the barrier film and the metal film above the fifth electrode film and into the second trench.

17. The method according to claim 16, wherein thinning the sixth electrode film comprises an anisotropic etch back.

* * * * *